United States Patent
Son (10) Patent No.: US 7,352,126 B2
(45) Date of Patent: Apr. 1, 2008

(54) ORGANIC ELECTRO-LUMINESCENCE DISPLAY DEVICE AND FABRICATING METHOD THEREOF

(75) Inventor: Woo Hyun Son, Gyeongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 269 days.

(21) Appl. No.: 11/258,003

(22) Filed: Oct. 26, 2005

(65) Prior Publication Data

US 2006/0097626 A1    May 11, 2006

(30) Foreign Application Priority Data

Nov. 11, 2004    (KR) .................. 10-2004-0092139

(51) Int. Cl.
*H01J 1/62*    (2006.01)

(52) U.S. Cl. .................................... 313/506

(58) Field of Classification Search .............. 313/498, 313/504, 506, 509, 292
See application file for complete search history.

(56) References Cited

U.S. PATENT DOCUMENTS

| | | |
|---|---|---|
| 5,701,055 A | 12/1997 | Nagayama et al. |
| 2002/0110940 A1 | 8/2002 | Yagamata et al. |
| 2003/0015961 A1 | 1/2003 | Yamazaki |
| 2004/0113550 A1 | 6/2004 | Adachi et al. |

*Primary Examiner*—Vip Patel
(74) *Attorney, Agent, or Firm*—Birch, Stewart, Kolasch & Birch, LLP

(57) ABSTRACT

There are disclosed an organic electro luminescence display device that is adaptive for preventing a defect in forming a barrier rib, and a fabricating method thereof.

An organic electro luminescence display device according to an embodiment of the present invention includes first and second electrodes formed to cross each other with an organic light emitting layer therebetween; a barrier rib which crosses the first electrode and is parallel to the second electrode; and an insulating film which is located between the barrier rib and the first electrode and defines an area of forming the organic light emitting layer, and wherein the insulating film has at least one groove which is provided in a contact area with the barrier rib.

2 Claims, 14 Drawing Sheets

ORGANIC ELECTRO-LUMINESCENCE DISPLAY DEVICE AND FABRICATING METHOD THEREOF

This application claims the benefit of the Korean Patent Application No. P2004-92139 filed on Nov. 11, 2004, which is hereby incorporated by reference.

BACKGROUND OF THE INVENTION

1. Field of the Invention

The present invention relates to an organic electro luminescence display device, and more particularly to an organic electro luminescence display device that is adaptive for preventing a defect in forming a barrier rib, and a fabricating method thereof.

2. Description of the Related Art

Recently, there have been developed a variety of flat panel display devices that can reduce their weight and size, which are a disadvantage of a cathode ray tube CRT. The flat panel display device includes a liquid crystal display LCD, a field emission display FED, a plasma display panel PDP and an electro luminescence EL display device.

Especially, the EL display device basically has a shape of sticking an electrode to both side surfaces of an organic light emitting layer which is made up of a hole transport layer, a light emitting layer and an electron transport layer, and the EL display device attracts attention as a next generation flat panel display because of its wide viewing angle, high aperture ratio, high color sense and so on.

The EL display device is largely divided into an inorganic EL display device and an organic EL display device in accordance with a material used. The organic EL display device among these has an advantage of being driven with lower voltage than an inorganic EL display device because electrons and holes form pairs and then they become extinct to emit light when electric charges are injected into an organic EL layer which is formed between a hole injection electrode and an electron injection electrode. Further, the organic EL display device can form elements even on a transparent substrate which is flexible like plastics, and the organic EL display device can be driven at a low voltage of below 10V, has relatively low power consumption and has excellent color sense in comparison with the PDP or the inorganic EL display device.

Figure 1:
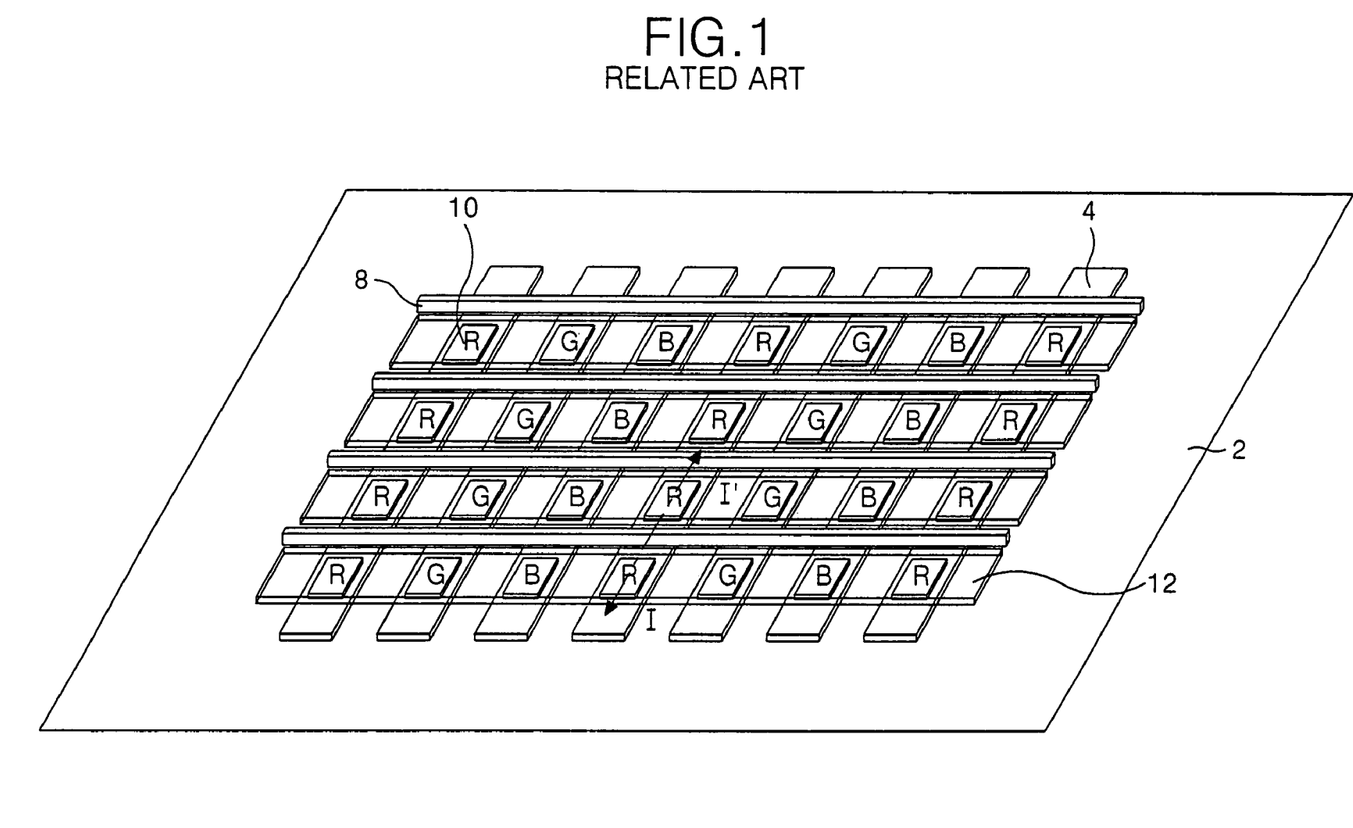
FIG. 1 a perspective view briefly illustrating a related art organic electro luminescence display device.
Figure 2:
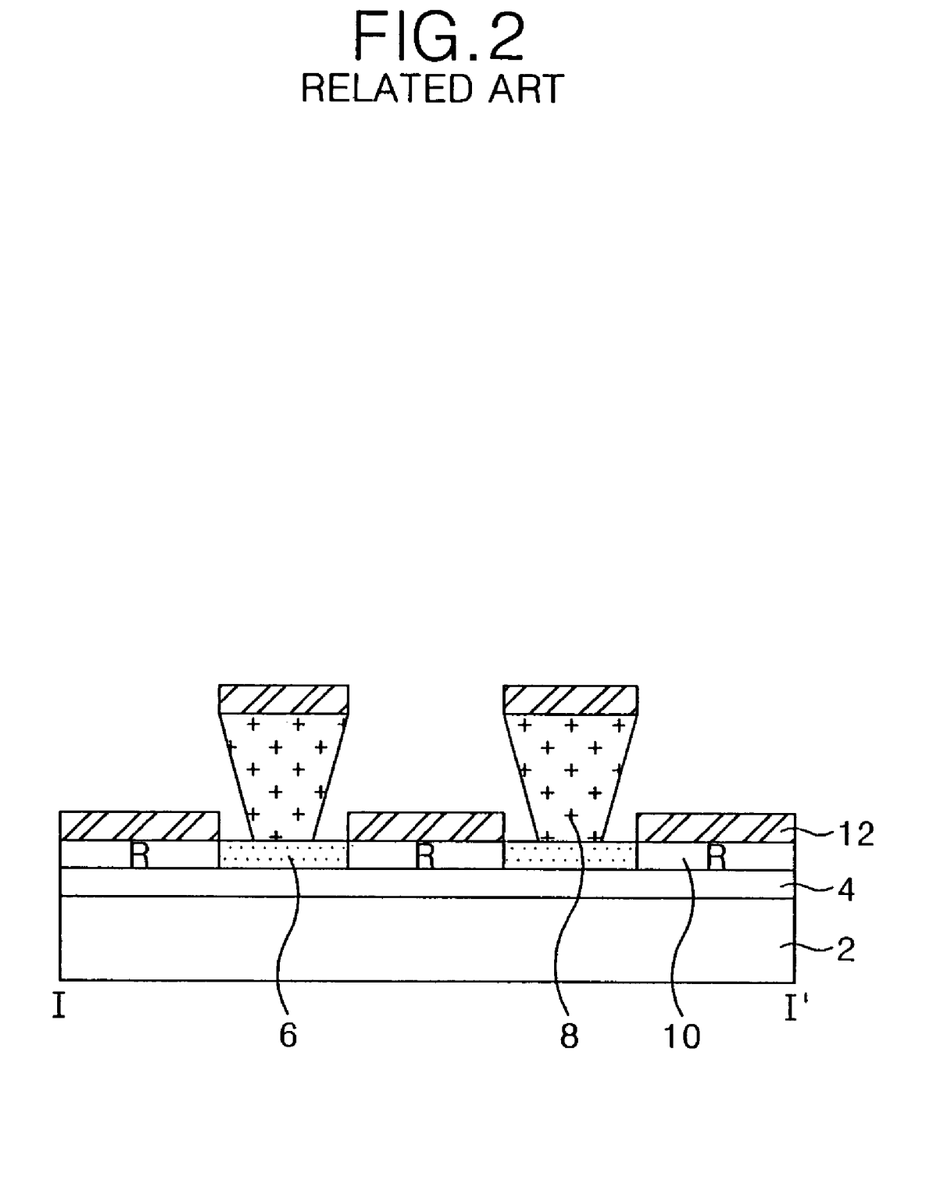
FIG. 2 is a diagram representing the organic electro luminescence display device shown in FIG. 1, taken along the line I-I'.

FIG. 1 is a perspective view representing a related art organic EL display device, and FIG. 2 is a diagram representing the organic EL display device shown in FIG. 1, taken along the line I-I'.

The organic EL display device shown in FIG. 1 has a first electrode (or an anode electrode) 4 and a second electrode (or a cathode electrode) 12 formed on a substrate 2 in a direction of crossing each other.

A plurality of anode electrodes 4 are formed on the substrate 2 to be separated from each other with a designated gap. An insulating film 6 having an aperture part for each EL cell area is formed on the substrate 2 where the anode electrode 4 is formed. Barrier ribs 8 are located on the insulating film 6 for separating an organic light emitting layer 10 and the cathode electrode 12 which are to be formed thereon. The barrier ribs 8 are formed in a direction of crossing the anode electrode 4 and have a reverse taper structure where an upper end part has a wider width than a lower end part. The organic light emitting layer 10 and the cathode electrode 12 formed of an organic compound are sequentially deposited over the entire surface of the insulating film 6 where the barrier ribs 8 are formed. The organic light emitting layer 10 has a hole transport layer, a light emitting layer and an electron transport layer deposited and formed on the insulating film. The organic EL display device has electrons and holes emitted if a driving signal is applied to the anode electrode 4 and the cathode electrode 12, and the electrons and holes emitted from the anode electrode 4 and the cathode electrode 12 are recombined within the organic light emitting layer 10 to generate a visible ray. At this moment, the generated visible ray exits to the outside through the anode electrode 4 to display a designated picture or image.

Hereinafter, in reference to FIGS. 3A to 3E, a fabricating method of the related art organic EL display device is described as follows.

Figure 3A:
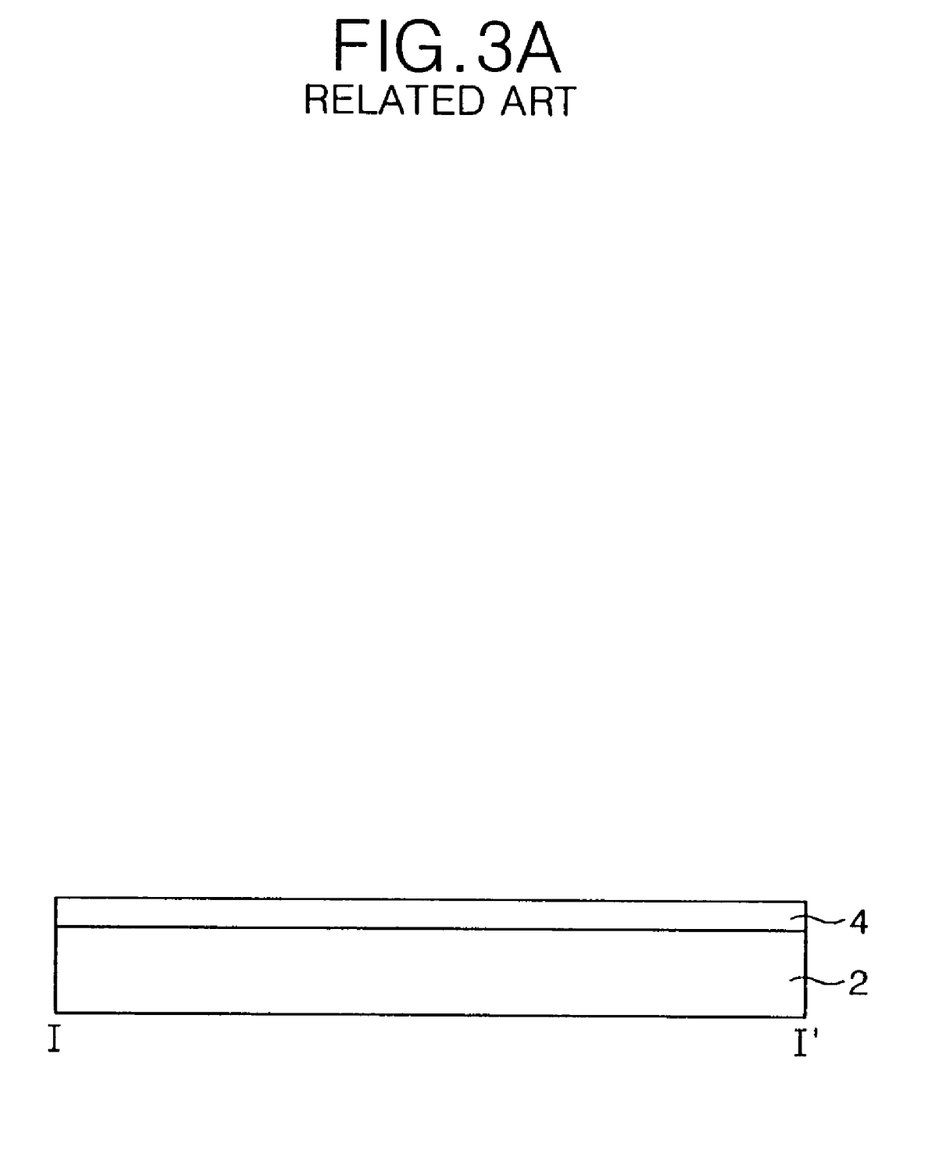
FIGS. 3A to 3E are diagrams representing a fabricating method of a related art organic electro luminescence display device.

Firstly, after depositing a transparent conductive metal material on the substrate 2 which is formed by use of soda lime or hard glass, the transparent conductive metal material is patterned by a photolithography process and an etching process, thereby forming the anode electrode 4, as shown in FIG. 3A. Herein, the metal material is indium tin oxide or SnO2.

Figure 3B:
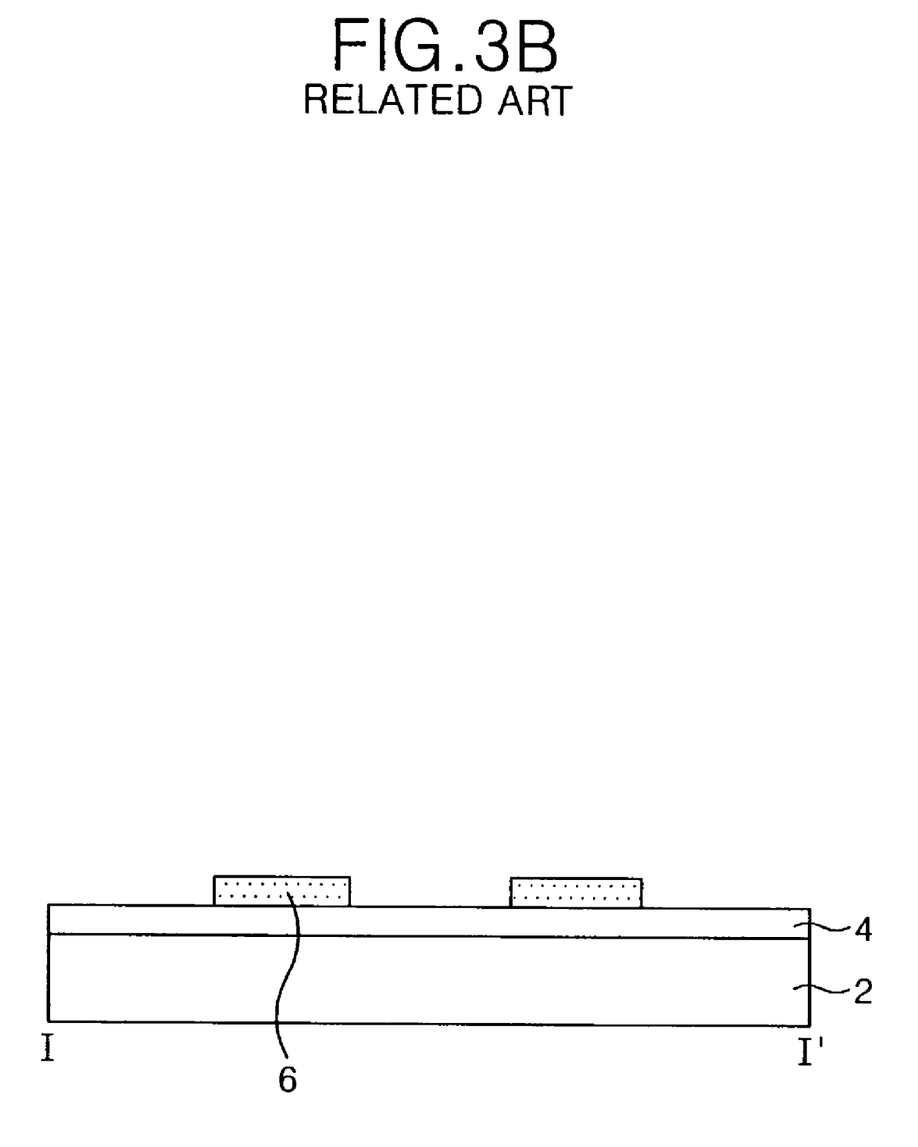

After a photo sensitive insulating material is coated by a spin coating method on the substrate 2 where the anode electrode 4 is formed, the photo sensitive insulating material is patterned by the photolithography process and the etching process, thereby forming an insulating film 6 for the light emitting area to be exposed, as shown in FIG. 3B.

Figure 3C:
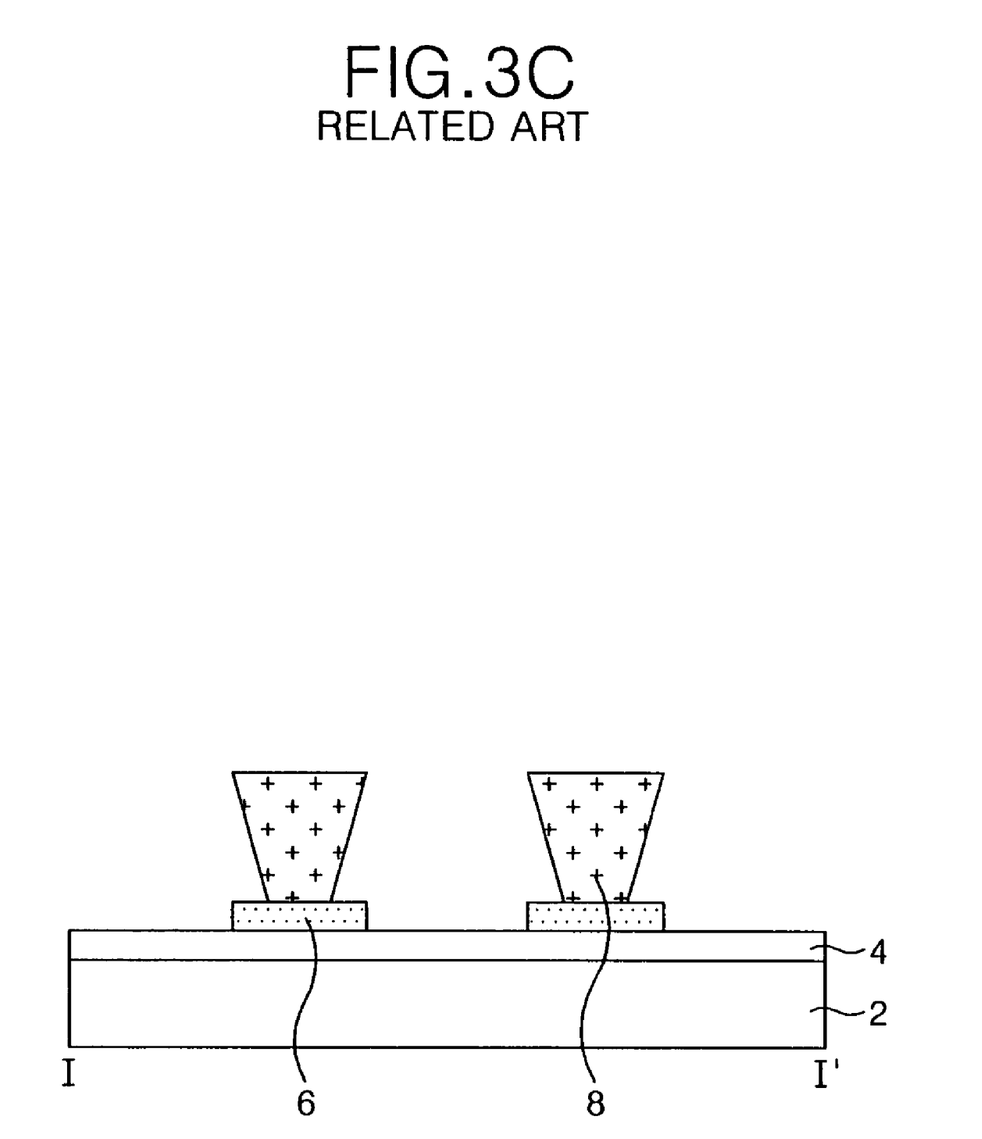

After a photo sensitive organic material is deposited on the insulating film 6, the photo sensitive organic material is patterned by the photolithography process and the etching process, thereby forming the barrier rib 8, as shown in FIG. 3C. The barrier rib 8 is formed in a non light emitting area to cross a plurality of anode electrodes 4 for dividing pixels.

Figure 3D:
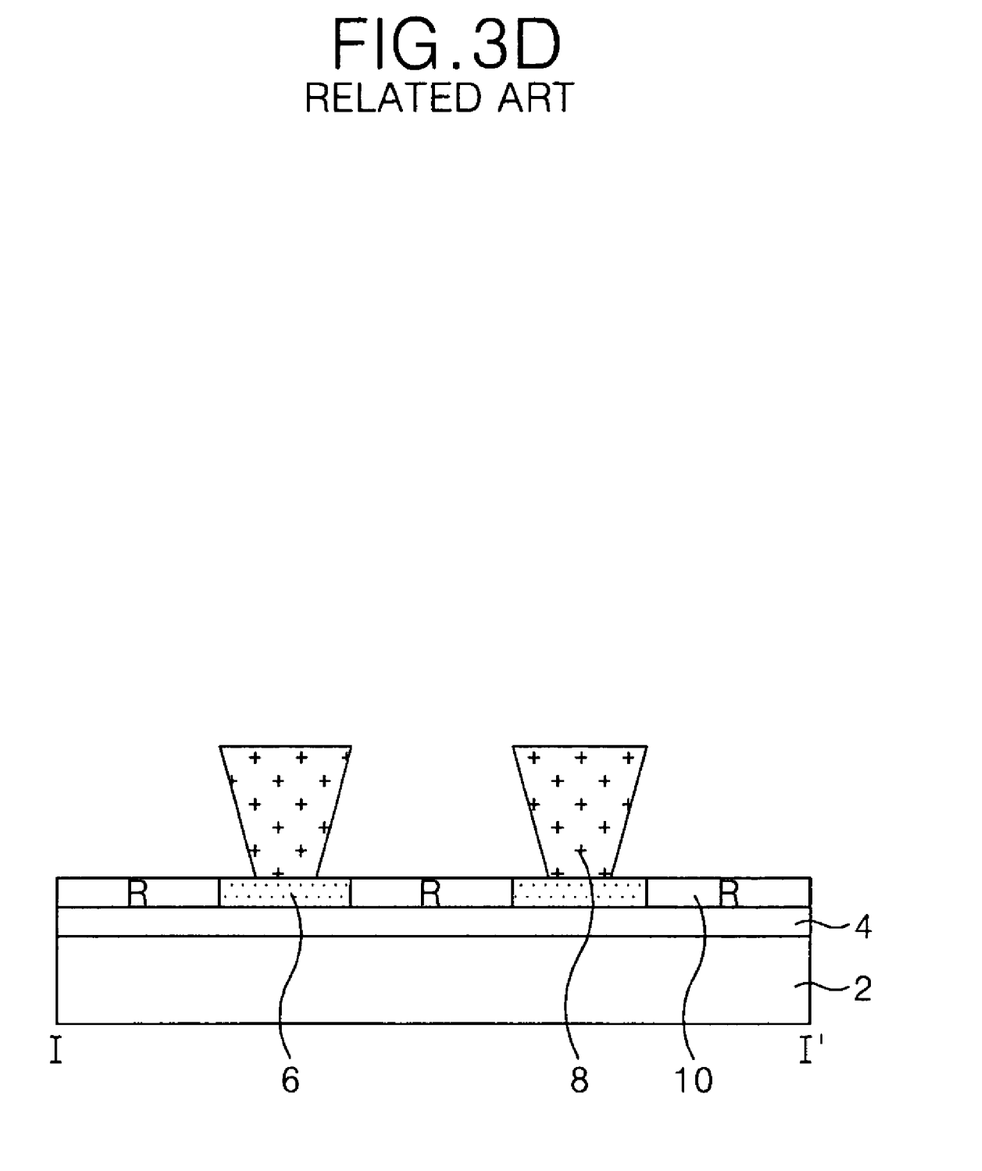

An organic material is deposited on the substrate where the barrier rib 8 is formed by use of a thermal deposition method and a vacuum deposition method in use of a shadow mask, thereby forming the organic light emitting layer 10, as shown in FIG. 3D.

Figure 3E:
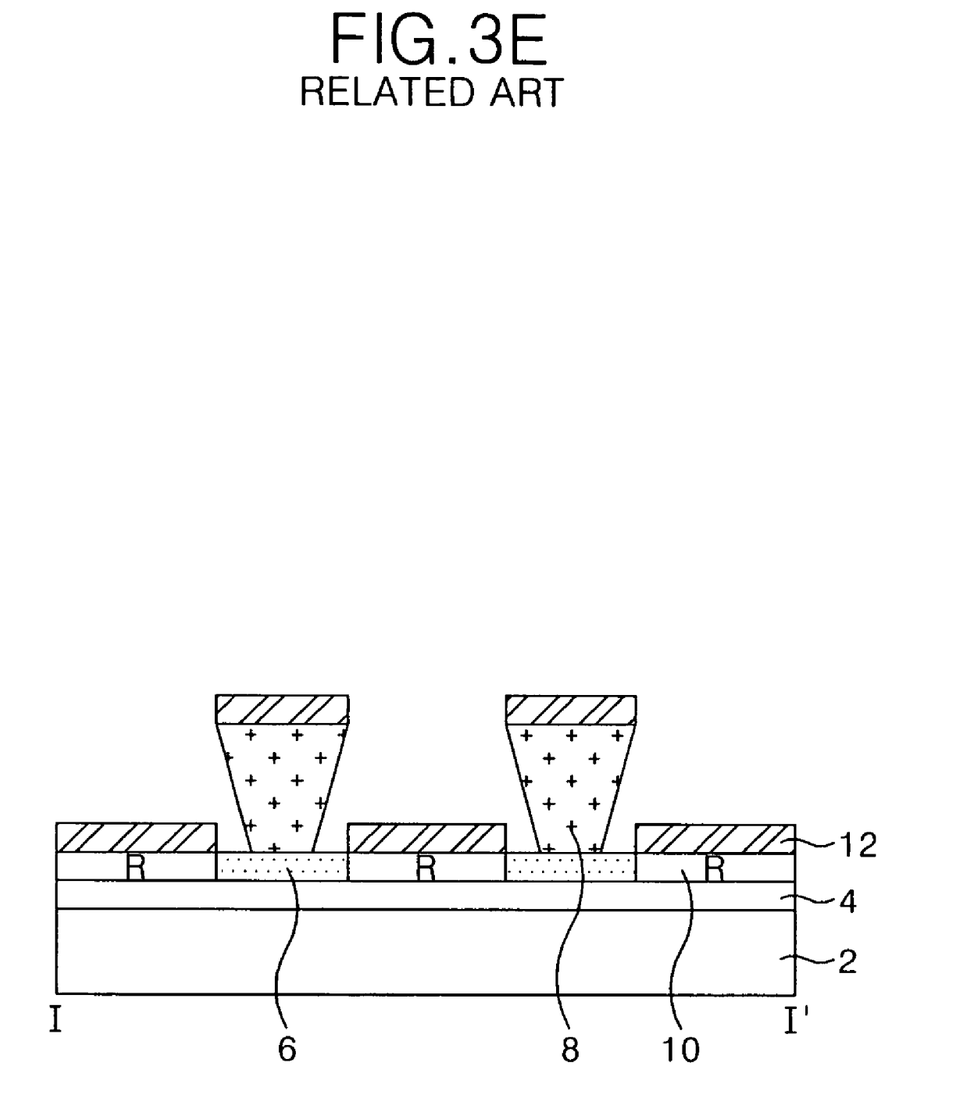

A metal material is deposited on the substrate 2 where the organic light emitting layer 10 is formed, thereby forming the cathode electrode 12, as shown in FIG. 3E.

On the other hand, the related art barrier rib 8 is formed in a reverse taper shape for dividing the cathode electrode 12, thus a contact area with the insulating film 6 becomes narrow. Hereby, there often occurs a defect that the barrier rib 8 is separated from the insulating film 6 upon a cleaning process among the process of forming the barrier rib 8 or in case that a small impact is applied to the organic EL display device.

SUMMARY OF THE INVENTION

Accordingly, it is an object of the present invention to provide an organic electro luminescence display device that is adaptive for preventing a defect in forming a barrier rib, and a fabricating method thereof.

In order to achieve these and other objects of the invention, an organic electro luminescence display device according to an aspect of the present invention includes first and second electrodes formed to cross each other with an organic light emitting layer therebetween; a barrier rib which crosses the first electrode and is parallel to the second electrode; and an insulating film which is located between the barrier rib and the first electrode and defines an area of forming the organic light emitting layer, and wherein the insulating film has at least one groove which is provided in a contact area with the barrier rib.

In the organic electro luminescence display device, the groove is filled with part of the barrier rib.

A fabricating method of an organic electro luminescence display device according to another aspect of the present invention includes the steps of forming a first electrode on a substrate; forming an insulating film which partially exposes the first electrode to define a light emitting area; forming a barrier rib which crosses the first electrode; forming an organic light emitting layer in the light emitting area; and forming a second electrode which crosses the first electrode with the organic light emitting layer therebetween, and wherein the step of forming the insulating film has the step of forming at least one groove which is filled with part of the barrier rib in a contact area with the barrier rib.

In the fabricating method, the step of forming the at least one groove includes the step of forming an insulating material on the substrate where the first electrode is formed; aligning a halftone mask which has a transmitting part, a shielding part and a semi transmitting part corresponding to an area where the groove is to be formed, on the substrate where the insulating material is formed; and patterning the insulating material by a photolithography process by use of the halftone mask.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 4:
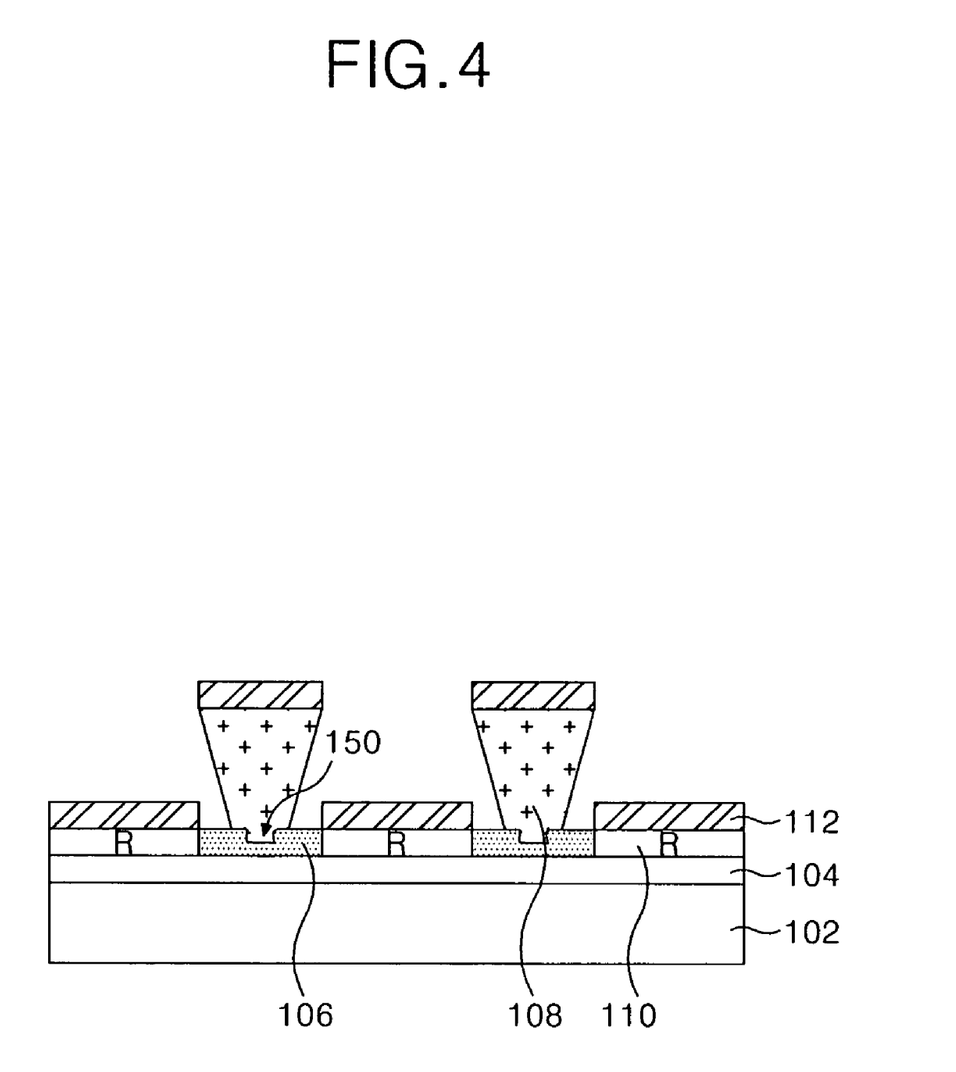
FIG. 4 is a sectional diagram representing an organic electro luminescence display device according to the present invention.
Figure 5A:
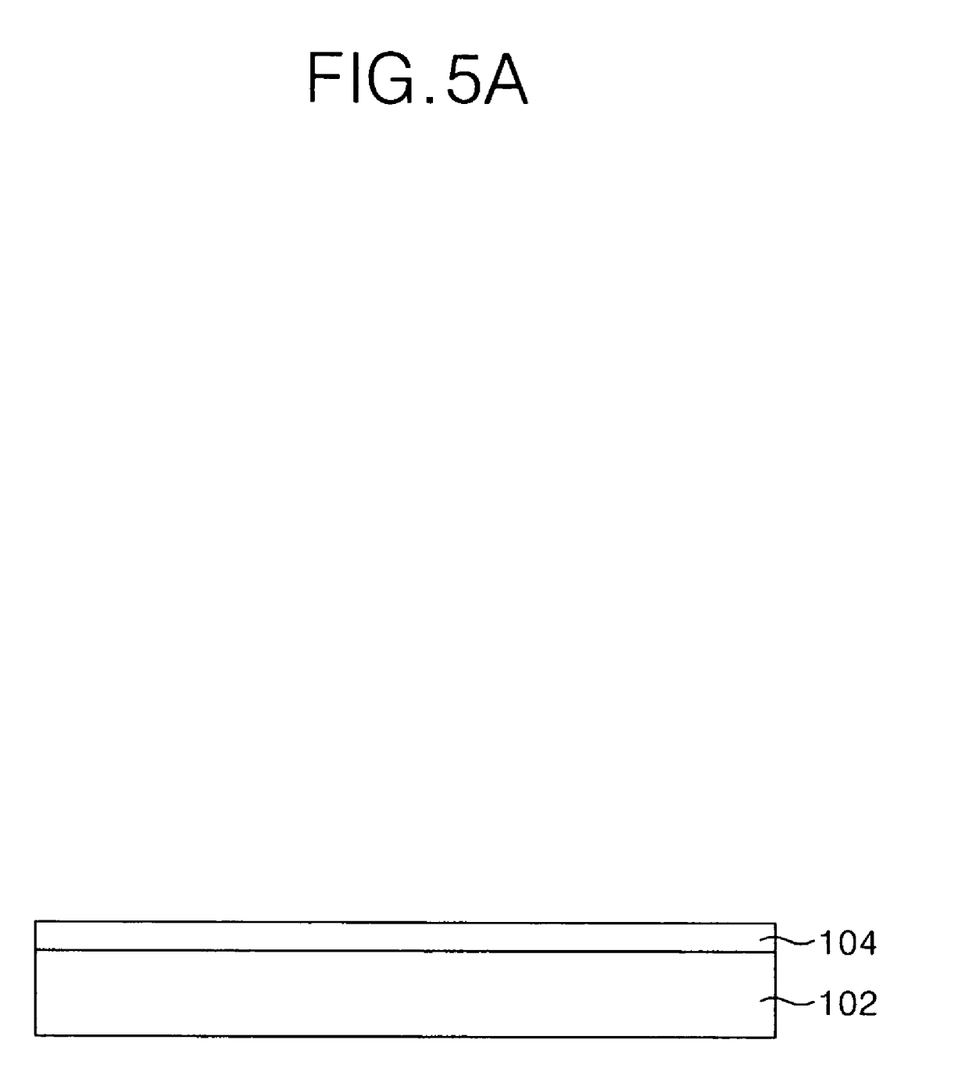
FIGS. 5A to 5E are diagrams representing a fabricating method of an organic electro luminescence display device according to the present invention.
Figure 5B:
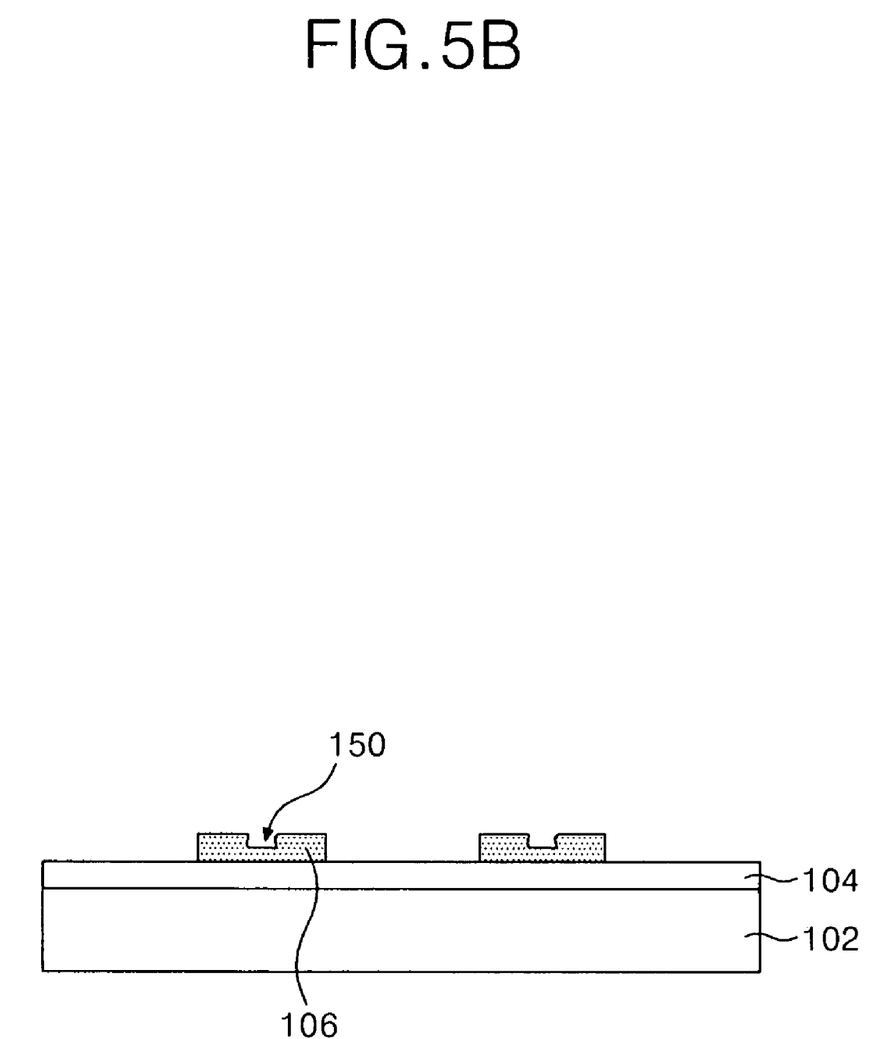
Figure 5C:
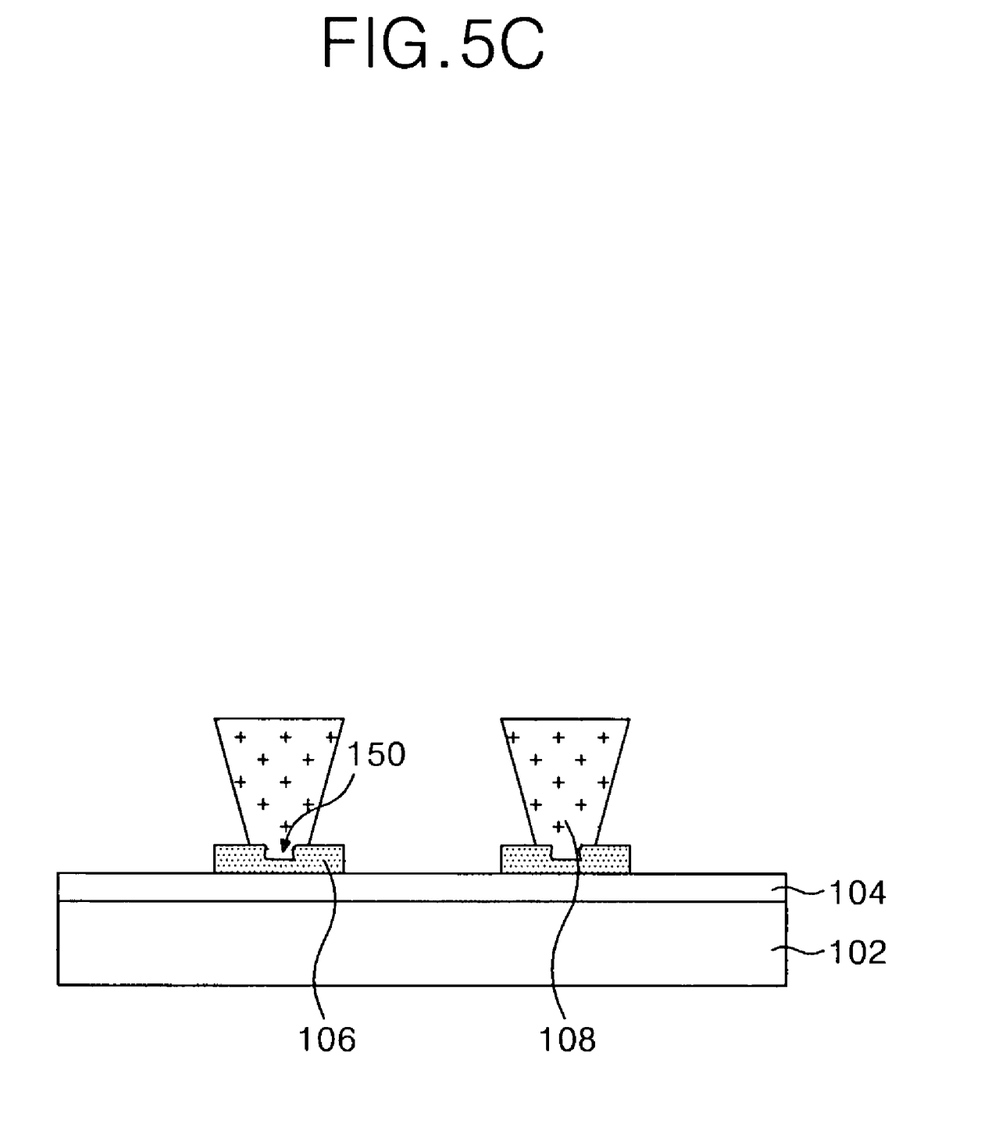
Figure 5D:
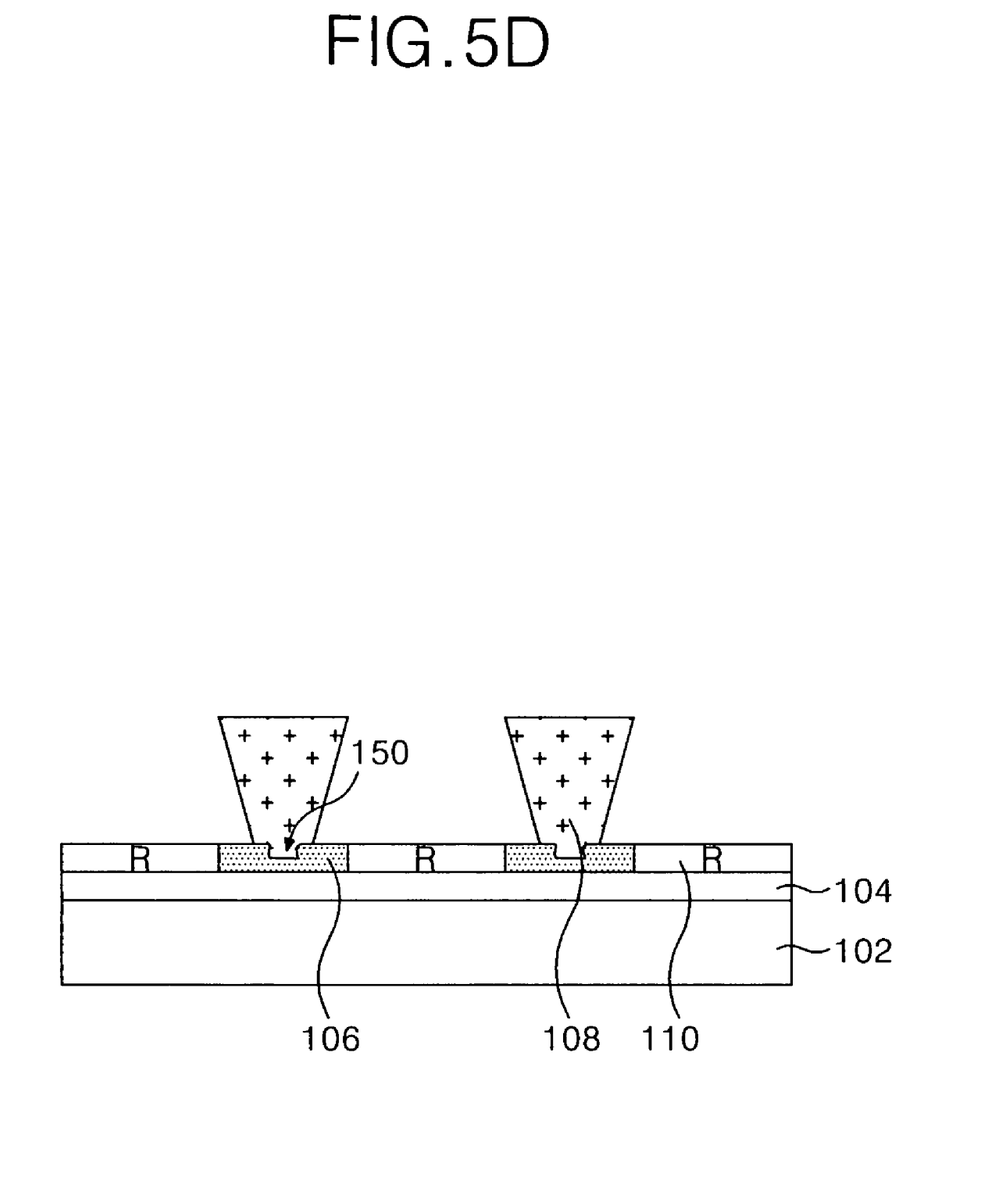
Figure 5E:
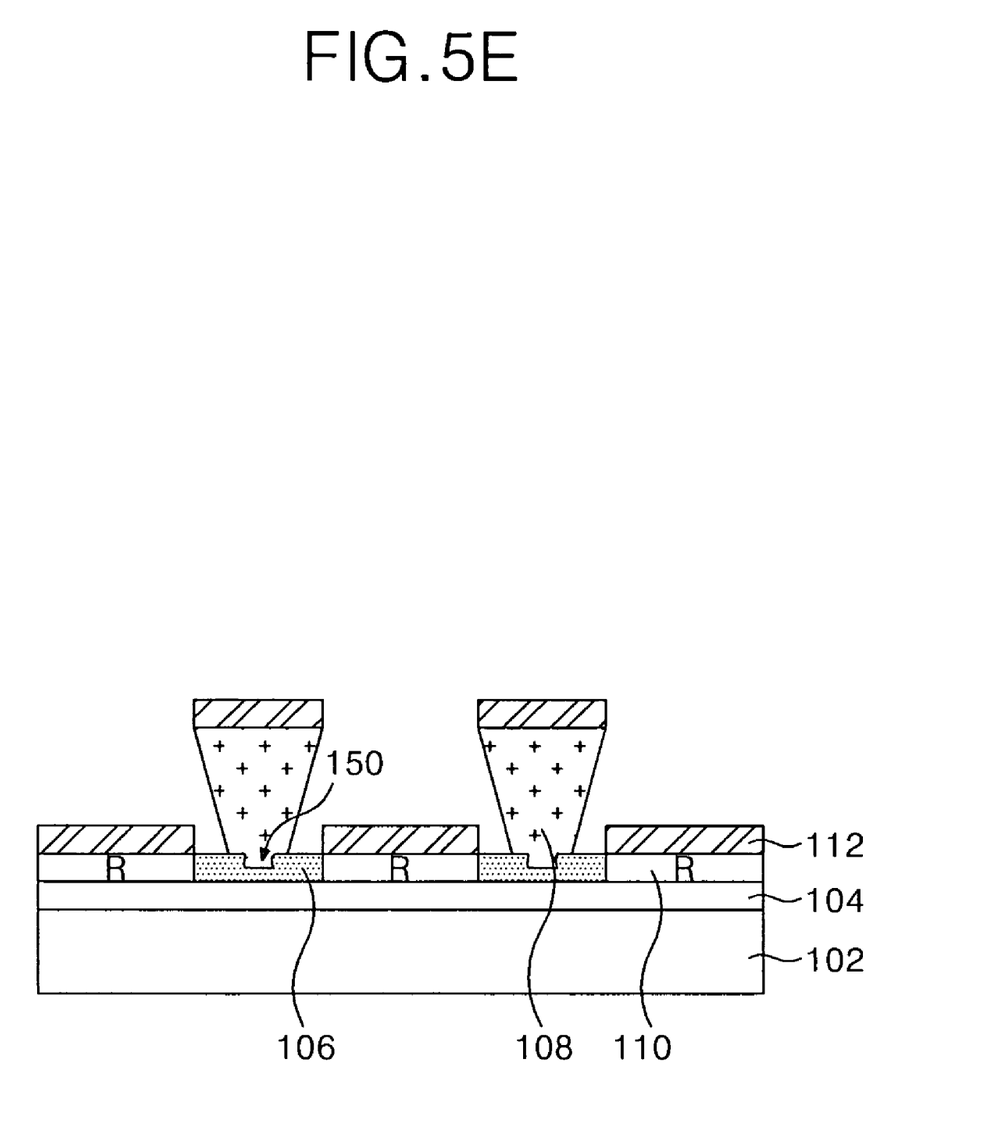
Figure 6:
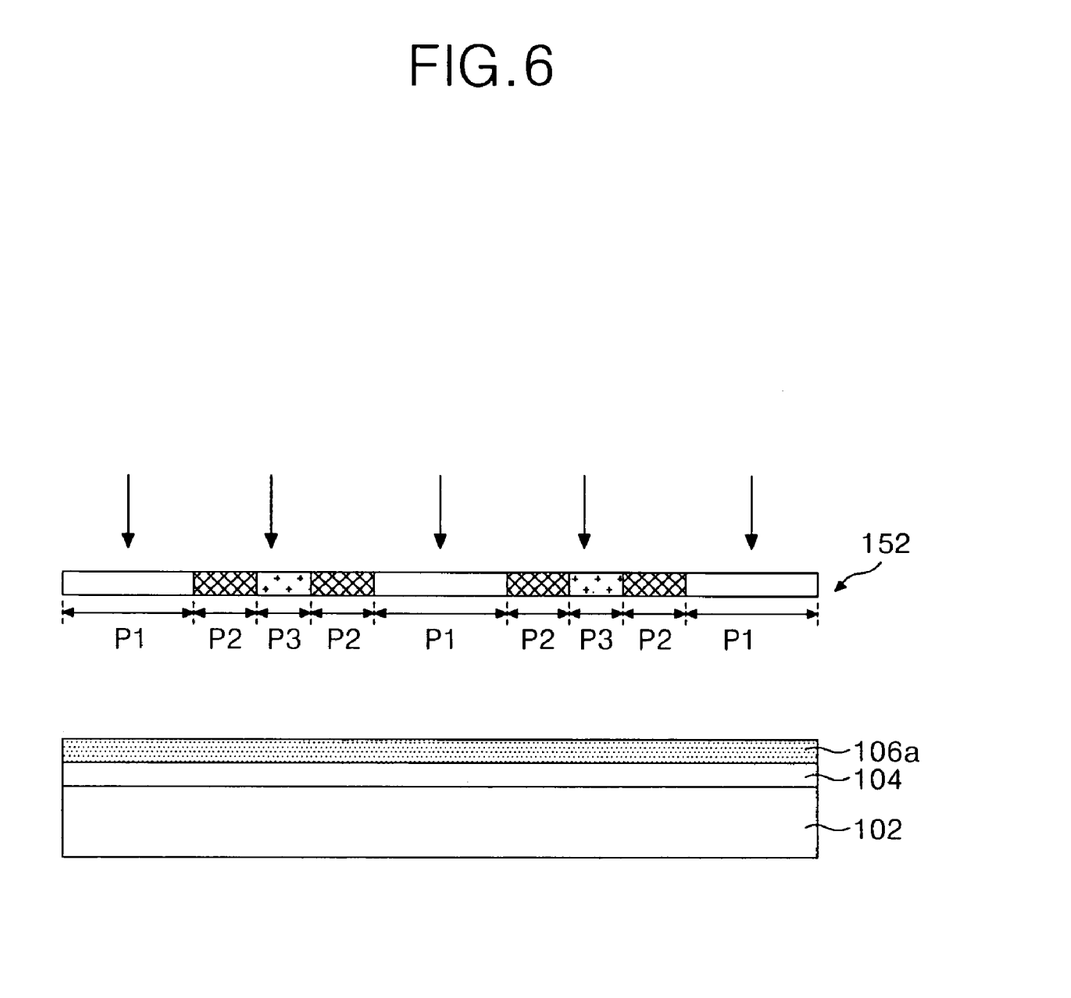
FIG. 6 is a diagram for explaining that a groove provided in an insulating film is formed by a halftone mask.

With reference to FIGS. 4 to 6, embodiments of the present invention will be explained as follows.

FIG. 4 is a sectional diagram representing an organic EL display device according to the present invention.

The organic EL display device shown in FIG. 4 has a first electrode (or an anode electrode) 104 and a second electrode (or a cathode electrode) 112 formed on a substrate 102 in a direction of crossing each other.

A plurality of anode electrodes 104 are formed on the substrate 102 to be separated from each other with a designated gap. An insulating film 106 having an aperture part for each EL cell area is formed on the substrate 102 where the anode electrode 104 is formed. Barrier ribs 108 are located on the insulating film 106 for separating an organic light emitting layer 110 and the cathode electrode 112 which are to be formed thereon. The barrier ribs 108 are formed in a direction of crossing the anode electrode 104 and have a reverse taper structure where an upper end part has a wider width than a lower end part. The organic light emitting layer 110 and the cathode electrode 112 formed of an organic compound are sequentially deposited over the entire surface of the insulating film 106 where the barrier ribs 108 are formed. The organic light emitting layer 110 has a hole transport layer, a light emitting layer and an electron transport layer deposited and formed on the insulating film 106.

At least one groove 150 is formed in a contact area of the barrier rib 108 and the insulating film 106. The groove 150 is formed on the insulating film 106 and part of the barrier rib 108 is filled into the groove 150, thus the contact area of the barrier rib 108 and the insulating film 106 is widened. Accordingly, the adhesive strength between the barrier rib 106 and the insulating film 106 is improved.

In this way, the organic EL display device according to the present invention has at least one groove 150 which is located at the contact area of the barrier rib 108 and the insulating film 106, and which is provided in the insulating film 106. Accordingly, the barrier rib 108 is not separated from the insulating film 106 upon the cleaning process of the barrier rib 108 or even when a small impact is applied to the organic EL display device.

Hereinafter, in reference to FIGS. 5A to 5E, a fabricating method of the related art organic EL display device is described as follows.

Firstly, after depositing a transparent conductive metal material on the substrate 102 which is formed by use of soda lime or hard glass, the transparent conductive metal material is patterned by a photolithography process and an etching process, thereby forming the anode electrode 104, as shown in FIG. 5A. Herein, the metal material is indium tin oxide or SnO2.

On the substrate 102 where the anode electrode 104 is formed, as shown in FIG. 5B, the light emitting area is exposed and there is formed the insulating film 106 having at least one groove 150 which is located at the contact area with the barrier rib 108 that is to be formed later.

In reference to FIG. 6, the process of forming the insulating film is specifically described as follows.

Firstly, a photo sensitive insulating material is coated by a spin coating method on the substrate 102 where the anode electrode 104 is formed. And then, a halftone mask 152 having a transmitting part P1, a shielding part P2 and a semi transmitting part P3 are aligned on the substrate 102. Herein, the semi transmitting part P3 corresponds to an area where the groove 150 is to be formed, and the shielding part P2 corresponds to an area where the insulating film 106 is to be formed. The photolithography process is performed by use of the halftone mask 152, thereby forming the insulating film 106 having the groove 150, as shown in FIG. 5B.

After a photo sensitive organic material is deposited on the substrate 102 where the insulating film 106 is formed, the photo sensitive organic material is patterned by the photolithography process and the etching process, thereby forming the barrier rib 108, as shown in FIG. 5C. The barrier rib 108 is formed in a non light emitting area to cross a plurality of anode electrodes 104 for dividing pixels. Herein, the part of the barrier rib 108 is filled into the groove 150 which formed on the insulating film 106, thus the barrier rib 108 can be firmly in contact with the insulating film 106.

An organic material is deposited on the substrate 102 where the barrier rib 108 is formed by use of a thermal deposition method and a vacuum deposition method in use of a shadow mask, thereby forming the organic light emitting layer 110, as shown in FIG. 5D.

A metal material is deposited on the substrate 102 where the organic light emitting layer 110 is formed, thereby forming the cathode electrode 112, as shown in FIG. 5E.

As described above, the organic EL display device and the fabricating method thereof according to the present invention has at least one groove which is located at the contact area of the barrier rib and the insulating film, and which is provided in the insulating film. Accordingly, the contact area of the barrier rib and the insulating film is widened, thereby improving the adhesive strength between the barrier rib and the insulating film. As a result, it is possible to prevent the defect in forming the barrier rib, e.g., the barrier rib being separated from the insulating film.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro luminescence display device, comprising:
    first and second electrodes formed to cross each other with an organic light emitting layer therebetween;
    a barrier rib which crosses the first electrode and is parallel to the second electrode; and
    an insulating film which is located between the barrier rib and the first electrode and defines an area of forming the organic light emitting layer, and
    wherein the insulating film has at least one groove which is provided in a contact area with the barrier rib.

2. The organic electro luminescence display device according to claim 1, wherein the groove is filled with part of the barrier rib.

* * * * *